United States Patent
Daveau et al.

(10) Patent No.: US 10,386,414 B2
(45) Date of Patent: Aug. 20, 2019

(54) METHOD FOR MANAGING THE OPERATION OF A TEST MODE OF A LOGIC COMPONENT WITH RESTORATION OF THE PRE-TEST STATE

(71) Applicants: STMICROELECTRONICS (GRENOBLE 2) SAS, Grenoble (FR); STMICROELECTRONICS (CROLLES 2) SAS, Crolles (FR)

(72) Inventors: Jean-Marc Daveau, Grenoble (FR); Philippe Roche, Biviers (FR); Didier Fuin, Lumbin (FR)

(73) Assignees: STMICROELECTRONICS (CROLLES 2) SAS, Crolles (FR); STMICROELECTRONICS (GRENOBLE 2) SAS, Grenoble (FR)

( * ) Notice: Subject to any disclaimer, the term of this patent is extended or adjusted under 35 U.S.C. 154(b) by 191 days.

(21) Appl. No.: 15/324,851

(22) PCT Filed: May 28, 2015

(86) PCT No.: PCT/EP2015/061839
§ 371 (c)(1),
(2) Date: Jan. 9, 2017

(87) PCT Pub. No.: WO2016/005098
PCT Pub. Date: Jan. 14, 2016

(65) Prior Publication Data
US 2017/0205461 A1 Jul. 20, 2017

(30) Foreign Application Priority Data
Jul. 9, 2014 (FR) ..................... 14 56627

(51) Int. Cl.
*G01R 31/3185* (2006.01)
*G01R 31/3177* (2006.01)
*G01R 31/317* (2006.01)

(52) U.S. Cl.
CPC ... *G01R 31/3177* (2013.01); *G01R 31/31701* (2013.01); *G01R 31/31723* (2013.01);
(Continued)

(58) Field of Classification Search
CPC ........ G01R 311/3177; G01R 31/31723; G01R 31/318555; G01R 31/31701; G01R 31/31724
(Continued)

(56) References Cited

U.S. PATENT DOCUMENTS 6,539,511 B1 * 3/2003 Hashizume ........ G01R 31/3004
714/726
8,225,158 B2 * 7/2012 Whetsel ........... G01R 31/31855
714/729
(Continued)

FOREIGN PATENT DOCUMENTS

EP 2199813 12/2009

*Primary Examiner* — Samir W Rizk
*Assistant Examiner* — Enam Ahmed
(74) *Attorney, Agent, or Firm* — Slater Matsil LLP

(57) ABSTRACT

A device may include a control circuit configured to place, after a normal mode operation of N flip-flops, the N flip-flops in a test mode in which the test input of the first flip-flop of the chain is intended to receive a first sequence of test bits A memory may be configured to store a sequence of N values delivered by the test output of the last flip-flop of the chain. The control circuit may be configured to deliver, at the test input of the first flip-flop of the chain, the sequence of N stored values to restore the state of the N flip-flops before their placement in the test mode.

20 Claims, 2 Drawing Sheets

(52) U.S. Cl.
CPC ............... *G01R 31/31724* (2013.01); *G01R 31/318555* (2013.01)

(58) Field of Classification Search
USPC ........................................ 714/727
See application file for complete search history.

(56) References Cited

U.S. PATENT DOCUMENTS

| | | | | |
|---|---|---|---|---|
| 8,726,109 | B2* | 5/2014 | Sinanoglu | G01R 31/318541 |
| | | | | 714/727 |
| 2003/0126524 | A1* | 7/2003 | Kashihara | G01R 31/318541 |
| | | | | 714/718 |
| 2004/0148554 | A1* | 7/2004 | Dervisoglu | G01R 31/318335 |
| | | | | 714/727 |
| 2007/0150780 | A1 | 6/2007 | Shimooka | |
| 2008/0316850 | A1 | 10/2008 | Penzes | |
| 2010/0017496 | A1* | 1/2010 | Kimmel | G06F 12/0868 |
| | | | | 709/212 |
| 2010/0174956 | A1 | 7/2010 | Kawasaki et al. | |
| 2011/0258499 | A1* | 10/2011 | Casarsa | G01R 31/31701 |
| | | | | 714/726 |
| 2013/0031436 | A1* | 1/2013 | Mizutani | G01R 31/318541 |
| | | | | 714/729 |

* cited by examiner

METHOD FOR MANAGING THE OPERATION OF A TEST MODE OF A LOGIC COMPONENT WITH RESTORATION OF THE PRE-TEST STATE

RELATED APPLICATIONS

This application is a National Phase application of International Application serial no. PCT/EP2015/061839 filed May 28, 2015, which claims priority to French application No 1456627 filed Jul. 9, 2014 all of which are hereby incorporated herein in their entireties by reference.

TECHNICAL FIELD

The present application relates to the operation of electronic components and, more particularly, to the operation of a test mode of a logic component of an integrated circuit to detect a fault.

BACKGROUND

The impact of a particle on a transistor or close to a transistor can result in a stray current in an integrated circuit, according to the ionizing power of this particle for example, characterized by its linear energy transfer (LET). The quantity of charge generated by a particle corresponds to that applied during the change of state of a logic node controlled by a transistor. The consequence of this impact can be the change of state, or of levels, of the logic signals, and consequently lead to errors at the output of the circuit.

Some sectors of business, such as aerospace or the medical sector, need a component robustness that allows for a response reliability close to 100%, this feature taking precedence over all the other factors.

To check the state of the electronic components of an integrated circuit in particular, it is a known practice to perform a test using an automatic test pattern generator, generally referred to by the acronym ATPG. This is done upon leaving the integrated circuit production line, and/or, in certain cases, built-in standalone tests, referred to by the acronym LBIST (Logic Built-In Self-Test) during the operation of the circuit.

An ATPG is a computer-assisted test method used to find an input test sequence which, when it is applied to an integrated circuit, enables a test equipment item external to the integrated circuit to distinguish between a normal behavior and a defective behavior of the electronic circuit being tested. The test sequences generated are used to test semiconductor devices as they leave the production line before they are put in use.

A built-in standalone test method, often referred to by the acronym BIST (Built-In Self-Test), is a mechanism, enabling a hardware or software system, or a system comprising both, to perform its own diagnostic procedure independently. The diagnostic procedure can be initiated automatically, for example, at regular intervals or each time the integrated circuit is started up by triggering a self-monitoring circuit, or even continuously.

This mechanism is often found in integrated circuits, because it allows for checking of the circuit to be automated. This checking is done before the functional check.

The LBIST test is a form of BIST test in which the integrated circuits are configured to be capable of performing their own operation test. This is done without computer assistance or other external equipment.

The LBIST test comprises an advantage of making it possible to test internal electronic circuits that do not have external connection terminals, allowing the circuit to be connected directly to an external automated system such as an ATPG. It also offers the advantage of being able to initiate a test phase at any moment during the life of the integrated circuit.

In an LBIST test, at least one test sequence is injected into the electronic components to be tested. An analysis of the signal is obtained at the output of the components in response to the injected test sequence.

The major drawback is that, when an LBIST test phase is initiated during the operation, the information contained in each of the electronic components is lost. Consequently, the integrated circuit cannot resume its operation following the test precisely in the state in which it was before the test.

SUMMARY

According to one embodiment and one implementation, there is proposed a method and architecture for managing the operation of a logic component that makes it possible to perform a test phase during operation of the integrated circuit, and to restore the logic component on completion of the test phase to the state in which it was before this test phase.

According to one aspect, there is proposed a method for managing the operation of a set of N flip-flops of an integrated circuit chained together via their test output and their test input. The method according to this aspect comprises, after a normal mode of operation of the N flip-flops, a placement of the N flip-flops in a test mode.

The test mode comprises an injection of a first sequence of N test bits into the test input of the first flip-flop of the test chain, storage of the sequence of N values delivered by the test output of the last flip-flop of the test chain resulting from the injection of the first sequence of N test bits. Subsequently, an injection of the sequence of the N stored values into the test input of the first flip-flop of the test chain is performed to restore the state of the N flip-flops before their placement in the test mode.

The injection of a sequence of N test bits into the test input of the first flip-flop of a test chain formed by N flip-flops causes each of the N flip-flops to be placed in a determined state, with each flip-flop having copied a test bit on its output on completion of the injection. On completion of the injection, the first test bit of the sequence is copied at the output of the last flip-flop of the chain, and the last test bit of the sequence is copied at the output of the first flip-flop of the test chain.

The injection of a sequence of bits into the test chain causes the state of the flip-flops to be pushed, i.e., shifted, from flip-flop to flip-flop from the input to the output of the test chain. The values of the flip-flops of the test chain are thus one-by-one delivered at the output of the test chain as the test bits of the test sequence are injected. The storage of the N values delivered by the test output of the last flip-flop of the test chain during the initiation of the test phase by the injection of the first sequence of N test bits makes it possible to store the state of the set of N flip-flops during the operation of the test phase of the logic component with no time wasted.

The storage means can be coupled to a test output terminal coupled to the test output of the last flip-flop of the test chain. The test output terminal can also be coupled to the means for analysing the results of the test phase. Since the N first values delivered on the test output terminal upon initiation of the test phase do not result from an operation of the flip-flops with test bits at the input, these values are not analysed by the analysis means and can therefore be directly sent to the storage means.

Since the test output and the data output of a flip-flop have the same value at the output at each instant, the N stored values are re-injected into the test chain via the test input of the first flip-flop of the test chain before the normal operation of the set of the N flip-flops resumes. Once the entire sequence has been injected, each of the N flip-flops of the set once again has, on its data output, the value that it had before the initiation of the test phase.

Advantageously, the test mode further comprises an injection of at least one second sequence of N test bits following the injection of the first sequence of N test bits. The injection of a plurality of test bit sequences makes it possible to multiply the fault detection sequences, and thus to enhance the detecting and the locating of faults in the circuit.

The injection of the sequence of N stored values can be performed following the injection of the last sequence of N test bits. In the case where the method comprises the injection of a single test sequence, the injection of the sequence of N stored values is performed following the injection of the single test sequence.

In this way, the injection of the sequence of the N stored values makes it possible to extract the last sequence of values resulting from the test phase. The use of the sequence of the N stored values to extract the last result sequence makes it possible to optimize the test phase time-wise, and not waste time in restoring the state of the flip-flops preceding the test phase.

According to another aspect, a device is proposed which comprises an integrated circuit comprising a set of N flip-flops, each flip-flop having a data input, a test input, a test output and a data output. The N flip-flops of the set is coupled in series via their test input and their respective test output to form a chain of N flip-flops comprising a test chain input and a test chain output.

According to a general feature of this aspect, the device comprises a control circuit configured to place, after a normal mode of operation of the flip-flops, the set of N flip-flops in a test mode in which the test input of the first flip-flop of the test chain is intended to receive at least one first sequence of N test bits. The device also comprises storage means configured to store the sequence of N values delivered by the test output of the last flip-flop of the test chain. The control circuit is further configured to deliver, to the test input of the first flip-flop of the test chain, the sequence of N stored values to restore the state of the N flip-flops before their placement in the test mode, that is to say, the state that each of the N flip-flops had before beginning the test phase.

The test input of the first flip-flop of the test chain may also receive the sequence of N test bits following the first sequence of N test bits. The test input of the first flip-flop of the test chain may also receive the sequence of the N stored values following the injection of the last sequence of test bits.

Advantageously the storage means can comprise a random access memory external to the integrated circuit comprising the set of flip-flops. Preferably, the random access memory is mounted on the same support as the integrated circuit to which it is coupled.

BRIEF DESCRIPTION OF THE DRAWINGS

Other advantages and features of the invention will become apparent upon examining the detailed description of an embodiment and an implementation, that are in no way limiting, and the attached drawings in which.

DETAILED DESCRIPTION

Figure 1:
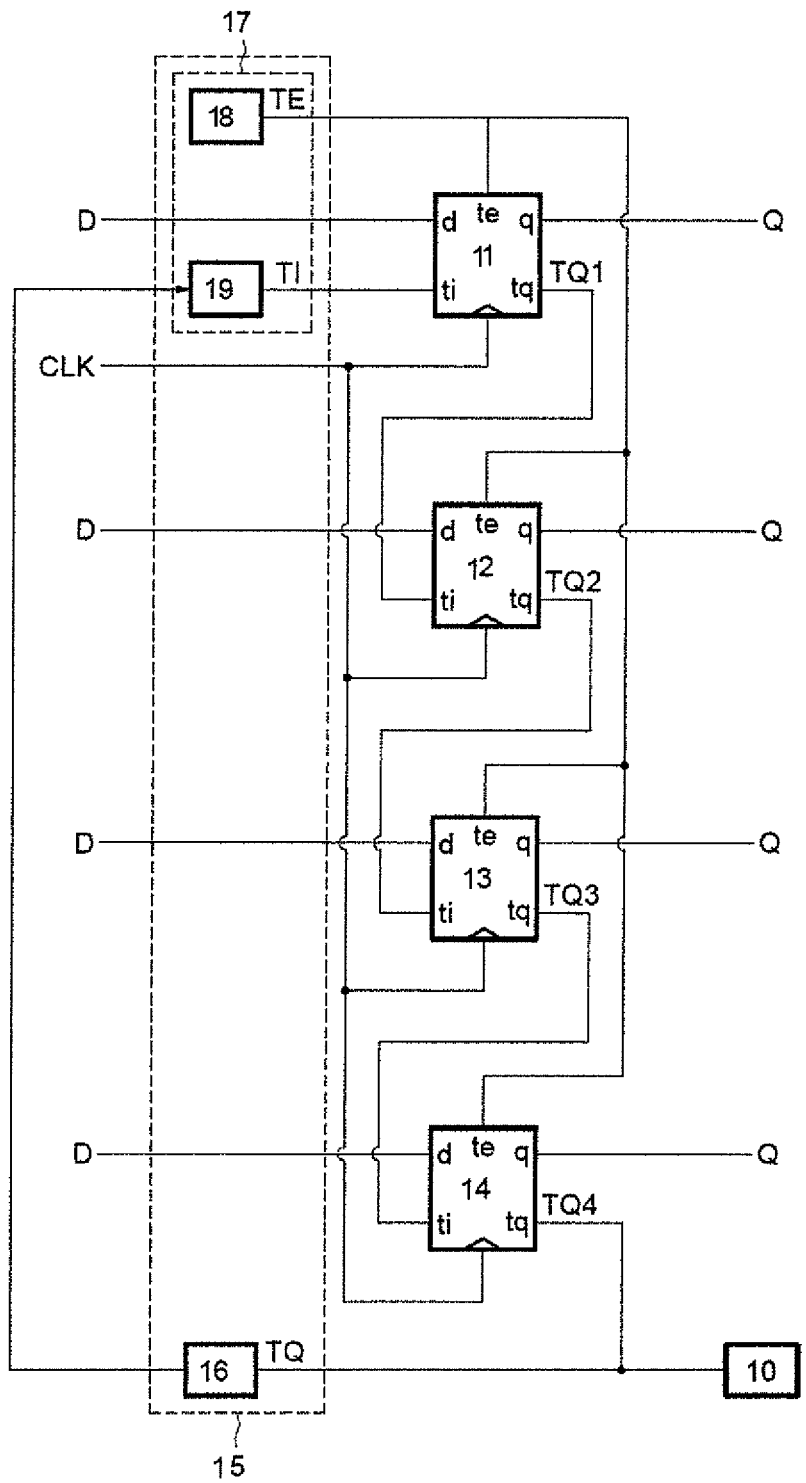
FIG. 1 is a schematic diagram of an integrated circuit according to one embodiment.

In the example illustrated in FIG. 1, the integrated circuit includes a set of four flip-flops 11 to 14. Each flip-flop 11 to 14 has a data input d suitable for receiving a data signal D and a data output q suitable for delivering an output signal Q and a clock input. The clock input of each of the four flip-flops 11 to 14 of the integrated circuit receives the same clock signal CLK. The flip-flops 11 to 14 are thus synchronized. In another embodiment, the flip-flops of the integrated circuit can receive different clock signals.

In normal operating mode, the flip-flops 11 to 14 work by copying the data signal D at the input on their data output q on each rising clock edge. The output signal Q normally corresponds to the data signal D at the end of the rising clock edge. The data signal D delivered to each flip-flop 11 to 14 can be the same or else different and independent of the data signal D delivered to the three other flip-flops.

Each flip-flop 11 to 14 further comprises a test input ti suitable for receiving a test signal TI, TQ1, TQ2 or TQ3 depending on the flip-flop, a test output tq suitable for delivering a test result signal TQ1 to TQ4, and a test mode control input to intended to receive a test control signal TE to actuate the test mode of the flip-flop. In test operating mode, each flip-flop 11 to 14 works by copying the test signal TI, TQ1, TQ2 or TQ3 at the testing input ti on the test output tq on each rising edge of its clock. The test output tq then delivers, at the output, a signal resulting from the test TQ, the value of which corresponds to the test signal TI, TQ1, TQ2 or TQ3 at the end of the rising clock edge.

The flip-flops 11 to 14 are coupled in series via their respective test input and output ti and tq to form a test chain with a test chain input and a test chain output. Thus, the test output tq of the first flip-flop 11 is coupled to the test input ti of the second flip-flop 12, the test output tq of the second flip-flop 12 is coupled to the test input ti of the third flip-flop 13, and the test output tq of the third flip-flop 13 is coupled to the test input ti of the fourth flip-flop 1. The test input ti of the first flip-flop 11 forms the input of the test chain and the test output tq of the fourth flip-flop 14 forms the test output of the test chain.

The integrated circuit comprises a device 15 for managing the operation of the set of four flip-flops. The management device 15 comprises a random access memory 16 mounted on the same support as the flip-flops 11 to 14 of the integrated circuit. The random access memory 16 is coupled to the output of the test chain, i.e., to the test output tq of the fourth flip-flop 14.

The management device 15 further comprises a control circuit 17 configured to place, after a normal mode of operation of the flip-flops 11 to 14, the set of four flip-flops 11 to 14 in a test mode. The control circuit 17 can be produced using a circuit or logic components.

Figure 2:
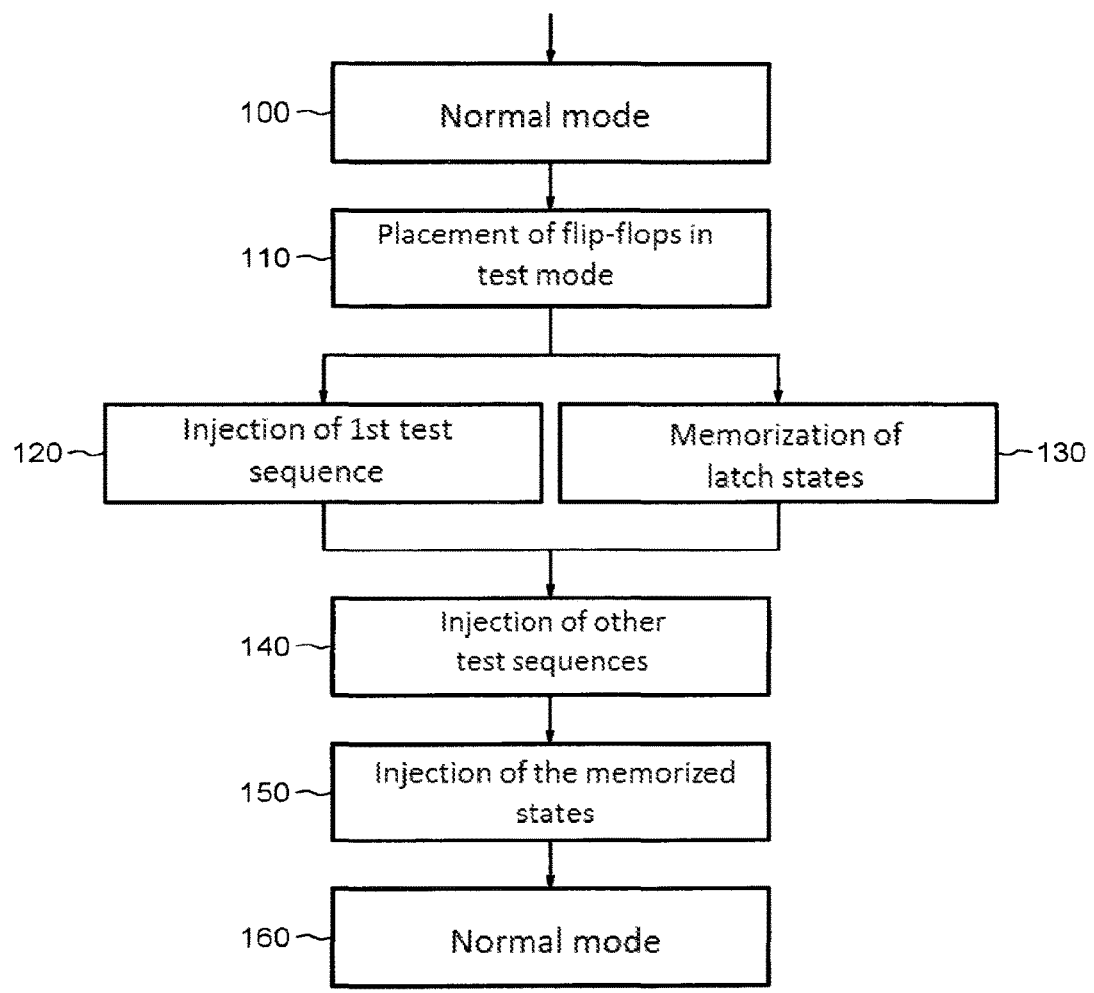
FIG. 2 is a flow diagram of a method for managing the operation of a set of N flip-flops of an integrated circuit according to one implementation of the invention.

FIG. 2 presents a flow diagram of a method for managing the operation of a set of four flip-flops of an integrated circuit implemented by the management device 15 of FIG. 1. After an initial step 100 of operation in normal mode of the flip-flops 11 to 14, the control circuit 17 of the management device 15 controls, in a first step 110, the placement of the four flip-flops 11 to 14 in a test mode. The placement in the test mode is performed by the management device 15 using a control circuit 18 suitable for delivering, to the test control input to of each flip-flop 11 to 14, a control signal TE controlling the mode of the flip-flops suitable for switching the flip-flops 11 to 14 over into the test mode.

The management device 15 further comprises a circuit 19 for injecting a test signal TI suitable for defining a sequence of four test bits to be injected into the four flip-flops 11 to 14 of the integrated circuit. The sequence of test bits comprises a number of test bits corresponding to the number of flip-flops chained together in series by their test input and output ti and tq.

Once the four flip-flops 11 to 14 have been placed in the test mode, the management device 15 controls, in a second step 120, the injection of the test signal TI into the test chain. The injection of the four test bits into the test chain is performed on four clock edges given the chaining together of the four flip-flops 11 to 14. On each clock edge, a flip-flop copies, on its test output tq, the value of the signal that it has on its test input ti. The test sequence is thus propagated in the test chain.

In the case where the flip-flops are not defective at the end of the four clock edges, the first test bit of the test sequence is on the test output tq of the fourth flip-flop 14, the second test bit of the test sequence is on the test input ti of the fourth flip-flop 14 and on the test output tq of the third flip-flop 13, the third test bit of the test sequence is on the test input ti of the third flip-flop 13 and on the test output tq of the second flip-flop 12, and the fourth test bit of the test sequence is on the test input ti of the second flip-flop 12 and on the output tq of the first flip-flop 11. Simultaneously with the controlled injection of the first sequence of four test bits, the control circuit 17 of the management device 15 orders the memory 16, in a step 130, to store the four values of the signal delivered at the output of the test chain, i.e., on the test output tq of the fourth flip-flop 14, on the first four clock edges.

The four values stored on the four clock edges from the loading of the first test sequence correspond to the four values present on the four flip-flops 11 to 14 at the end of the normal mode of operation before the test mode is engaged. The four stored values therefore represent the state of the flip-flops 11 to 14 when the normal mode of operation has been interrupted.

More specifically, the first value delivered by the output of the test chain corresponds to the state of the fourth flip-flop 14, the second value delivered by the output of the test chain corresponds to the state of the third flip-flop 13, the third value delivered by the output of the test chain corresponds to the state of the second flip-flop 12, and the fourth value delivered by the output of the test chain corresponds to the state of the first flip-flop 11. When the test chain comprises a large number of flip-flops, it is possible to perform a block storage of n bits, for example in blocks of eight bits.

In the test mode of the device illustrated in FIG. 1, the control circuit 17 of the management device 15 orders, in a subsequent step 140, the injection of a plurality of additional test sequences. The result of each test sequence is extracted from the test chain via the test output tq of the fourth flip-flop which is further coupled to processing means 10 suitable for receiving, storing and processing the test result signals.

Once the last test sequence has been injected, to extract the results of the last sequence, and restore the state of the flip-flops 11 to 14 preceding the test mode without wasting time, the control circuit 17 orders, in a step 150, the injection of the sequence formed by the four stored values by the injection circuit 19. The injection circuit 19 is coupled to the random access memory 16 in such a way as to recover the stored values before injecting them.

The four stored values are injected at the input of the test chain in the order in which they were initially delivered by the output of the test chain. The state of each of the four flip-flops 11 to 14 is thus restored at the same time as the results of the last test sequence are delivered by the output of the test chain. The management device 15 then orders, in a step 160, the exit from the test mode of the flip-flops 11 to 14 by once again placing the flip-flops in a normal mode of operation using a corresponding flip-flop mode control signal TE delivered by the control circuit 18.

The method and the architecture for managing the operation of a logic component thus make it possible to perform a test phase during the operation of the integrated circuit and to restore the state of the logic component at the end of the test phase to resume precisely in the state in which it was before this test phase.

The invention claimed is:

1. A method for operating a plurality of flip-flops in an integrated circuit, each of the plurality of flip-flops comprising a control input, a data input, a data output, a test input, and a test output,
    wherein the plurality of flip-flops comprises a first flip-flop, a last flip-flop, and intervening flip-flops,
    wherein the test input of each of the intervening flip-flops is coupled to the test output of a previous adjacent flip-flop of the plurality of flip-flops, and
    wherein the test output of each of the remaining flip-flops is coupled to the test input of a subsequent adjacent flip-flop of the plurality of flip-flops,
    the method comprising:
    following a normal mode of operation of the plurality of flip-flops when the plurality of flip-flops are in an initial state, placing the plurality of flip-flops in a test mode by sending a control signal to the control input of each of the plurality of flip-flops, wherein the test mode comprises enabling the test input and the test output of each of the plurality of flip-flops and disabling the data input and the data output of each of the plurality of flip-flops;
    inputting a first sequence of N test bits into the test input of the first flip-flop of the plurality of flip-flops;
    storing a sequence of N values output by the test output of the last flip-flop of the plurality of flip-flops resulting from inputting the first sequence of N test bits; and
    inputting the sequence of N stored values into the test input of the first flip-flop of the plurality of flip-flops after the test mode to restore the flip-flops to the initial state prior to placement in the test mode.

2. The method of claim 1 wherein the test mode further comprises at least one second sequence of N test bits following the first sequence of N test bits.

3. The method of claim 1 wherein inputting the sequence of N stored values comprises inputting the sequence of N stored values following inputting of a last bit of the first sequence of N test bits.

4. An electronic device comprising:
    an integrated circuit comprising a plurality of flip-flops, each of the plurality of flip-flops comprising a control input, a data input, a data output, a test input, and a test output,
        wherein the plurality of flip-flops comprises a first flip-flop, a last flip-flop, and intervening flip-flops, wherein the test input of each of the intervening flip-flops is coupled to the test output of a previous adjacent flip-flop of the plurality of flip-flops, and wherein the test output of each of the remaining flip-flops is coupled to the test input of a subsequent adjacent flip-flop of the plurality of flip-flops;

a controller configured to place the plurality of flip-flops in a test mode following a normal mode of operation when the plurality of flip-flops are in an initial state by sending a control signal to the control input of each of the plurality of flip-flops, wherein the test mode comprises enabling the test input and the test output of each of the plurality of flip-flops and disabling the data input and the data output of each of the plurality of flip-flops, and input a first sequence of N test bits into the test input of the first flip-flop of the plurality of flip-flops; and a storage device configured to store a sequence of N values output by the test output of the last flip-flop of the plurality of flip-flops resulting from inputting the first sequence of N test bits, wherein the controller is further configured to input the sequence of N stored values into the test input of the first flip-flop of the plurality of flip-flops after the test mode to restore the flip-flops to the initial state prior to placement in the test mode.

5. The electronic device of claim 4 wherein the storage device comprises a random access memory external to the integrated circuit.

6. The electronic device of claim 5 further comprising a substrate upon which the integrated circuit and the random access memory are mounted.

7. The electronic device of claim 4 wherein the test mode further comprises at least one second sequence of N test bits following the first sequence of N test bits.

8. The electronic device of claim 4 wherein the controller is further configured to input the sequence of N stored values following inputting of a last bit of the first sequence of N test bits.

9. A device for testing an integrated circuit, the integrated circuit comprising a plurality of flip-flops, each of the plurality of flip-flops comprising a control input, a data input, a data output, a test input, and a test output, wherein the plurality of flip-flops comprises a first flip-flop, a last flip-flop, and intervening flip-flops, wherein the test input of each of the intervening flip-flops is coupled to the test output of a previous adjacent flip-flop of the plurality of flip-flops, wherein the test output of each of the remaining flip-flops is coupled to the test input of a subsequent adjacent flip-flop of the plurality of flip-flops, the device comprising:

a controller configured to place the plurality of flip-flops in a test mode following a normal mode of operation when the plurality of flip-flops are in an initial state by sending a control signal to the control input of each of the plurality of flip-flops, wherein the test mode comprises enabling the test input and the test output of each of the plurality of flip-flops and disabling the data input and the data output of each of the plurality of flip-flops, and input a first sequence of N test bits into the test input of the first flip-flop of the plurality of flip-flops; and a storage device configured to store a sequence of N values output by the test output of the last flip-flop of the plurality of flip-flops resulting from inputting the first sequence of N test bits, wherein the controller is further configured to input the sequence of N stored values into the test input of the first flip-flop of the plurality of flip-flops after the test mode to restore the flip-flops to the initial state prior to placement in the test mode.

10. The device of claim 9 wherein the storage device comprises a random access memory external to the integrated circuit.

11. The device of claim 10 further comprising a substrate upon which the integrated circuit and the random access memory are mounted.

12. The device of claim 9 wherein the test mode further comprises at least one second sequence of N test bits following the first sequence of N test bits.

13. The device of claim 9 wherein the controller is further configured to input the sequence of N stored values following inputting of a last bit of the first sequence of N test bits.

14. The method of claim 1, wherein storing the sequence of N values output by the test output of the last flip-flop comprises storing the sequence of N values in a random access memory.

15. The method of claim 14, wherein the random access memory is external to the integrated circuit.

16. The method of claim 14, wherein the integrated circuit and the random access memory are mounted on a same substrate.

17. The method of claim 1, wherein, for each of the plurality of flip-flops, the normal mode of operation comprises:

receiving a data signal at the data input; and copying the data signal on the data output.

18. The method of claim 1, wherein:

the normal mode of operation comprises receiving data in parallel, the data comprising a plurality of data signals received at each data input of the plurality of flip-flops, and outputting the data in parallel on each data output of the plurality of flip-flops; and the test mode further comprises receiving the first sequence of N test bits in series on each test input of the plurality of flip-flops, and outputting the first sequence of N test bits in series on each test output of the plurality of flip-flops.

19. The electronic device of claim 4, wherein:

the normal mode of operation comprises receiving data in parallel, the data comprising a plurality of data signals received at each data input of the plurality of flip-flops, and outputting the data in parallel on each data output of the plurality of flip-flops; and the test mode further comprises receiving the first sequence of N test bits in series on each test input of the plurality of flip-flops, and outputting the first sequence of N test bits in series on each test output of the plurality of flip-flops.

20. The device of claim 9, wherein:

the normal mode of operation comprises receiving data in parallel, the data comprising a plurality of data signals received at each data input of the plurality of flip-flops, and outputting the data in parallel on each data output of the plurality of flip-flops; and the test mode further comprises receiving the first sequence of N test bits in series on each test input of the plurality of flip-flops, and outputting the first sequence of N test bits in series on each test output of the plurality of flip-flops.

\* \* \* \* \*